(12) United States Patent
Takenaka et al.

(10) Patent No.: US 10,070,511 B2
(45) Date of Patent: Sep. 4, 2018

(54) WIRING BOARD AND METHOD FOR MANUFACTURING THE SAME

(71) Applicant: IBIDEN CO., LTD., Ogaki (JP)

(72) Inventors: Yoshinori Takenaka, Ogaki (JP); Hiroyasu Noto, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/682,827

(22) Filed: Aug. 22, 2017

(65) Prior Publication Data
US 2018/0054885 A1    Feb. 22, 2018

(30) Foreign Application Priority Data
Aug. 22, 2016    (JP) ................. 2016-161660

(51) Int. Cl.
| | | |
|---|---|---|
| H05K 1/00 | (2006.01) |
| H05K 1/02 | (2006.01) |
| H05K 3/00 | (2006.01) |
| H05K 3/46 | (2006.01) |

(52) U.S. Cl.
CPC ......... *H05K 1/0213* (2013.01); *H05K 3/0011* (2013.01); *H05K 3/4632* (2013.01)

(58) Field of Classification Search
CPC ... H05K 1/0213; H05K 3/0011; H05K 3/4632
USPC ............ 174/250, 251, 255–258, 261
See application file for complete search history.

(56) References Cited

U.S. PATENT DOCUMENTS

| | | | | |
|---|---|---|---|---|
| 2010/0006334 A1* | 1/2010 | Takenaka | ............ | H05K 3/465 174/262 |
| 2014/0251656 A1* | 9/2014 | Ikeda | ............ | H05K 3/4676 174/251 |
| 2016/0088727 A1* | 3/2016 | Furutani | ............ | H05K 3/4673 361/783 |

FOREIGN PATENT DOCUMENTS

JP    2005-217052 A    8/2005

* cited by examiner

*Primary Examiner* — Tremesha S Willis
(74) *Attorney, Agent, or Firm* — Oblon, McClelland, Maier & Neustadt, L.L.P.

(57) ABSTRACT

A wiring board includes an insulating resin layer including resin material and filler, and a conductive circuit layer laminated on a surface of the insulating resin layer and having wiring patterns. The filler has particle diameters of 15% or less of a minimum width of the wiring patterns when the particle diameters of the filler is measured in a unit range defined such that the unit range has a width and a length where the length is measured from the surface of the insulating resin layer and is selected from a smaller of twice the minimum width of the wiring patterns and a plate thickness of the insulating resin layer, and the width is twice the minimum width of the wiring patterns.

20 Claims, 10 Drawing Sheets

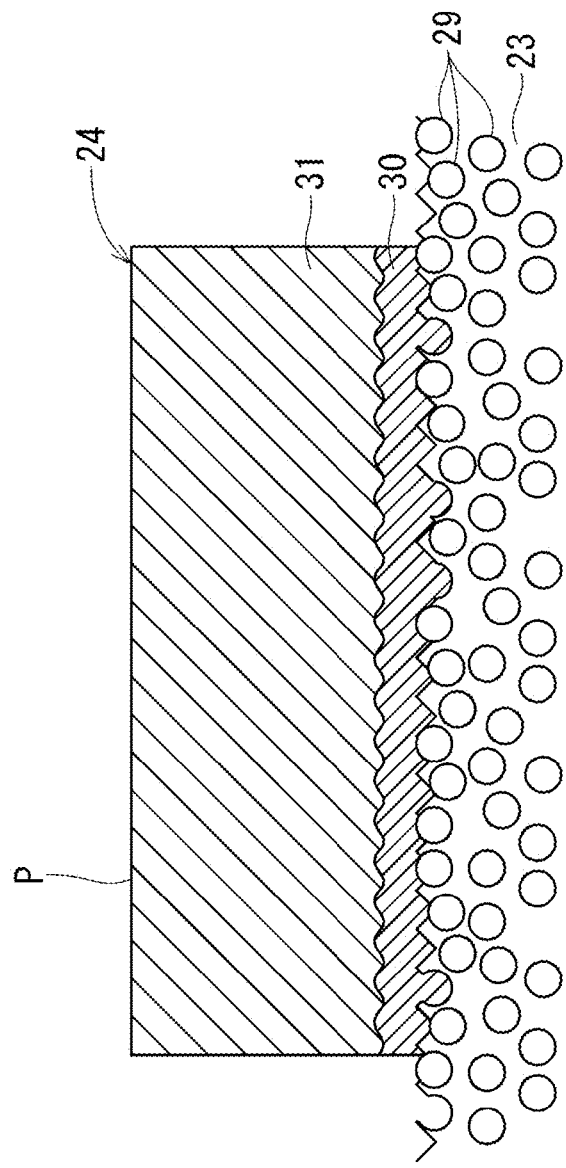

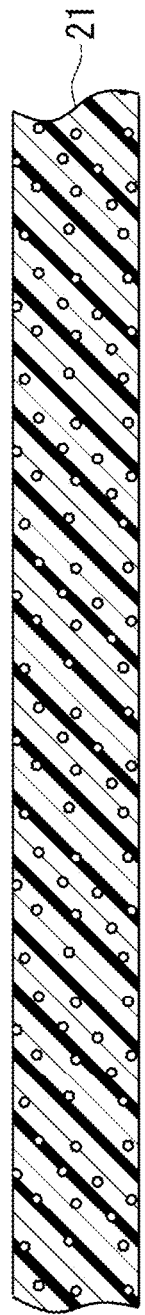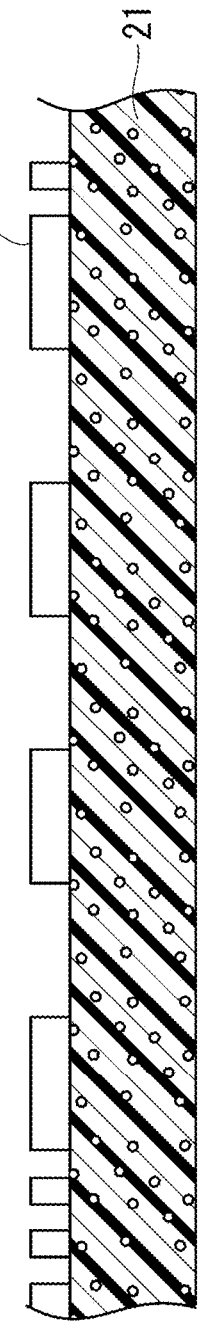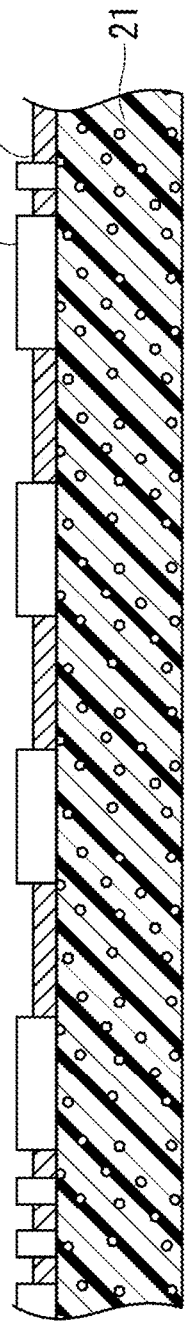

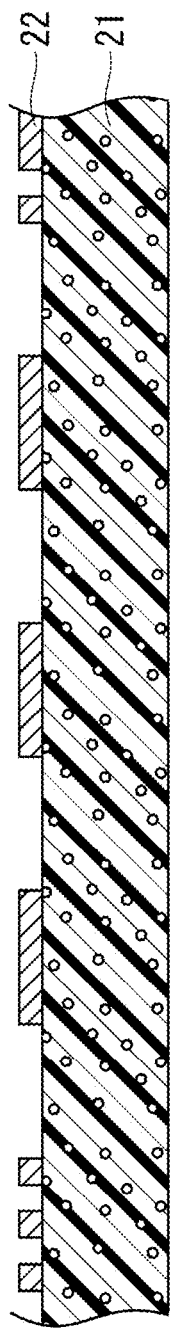
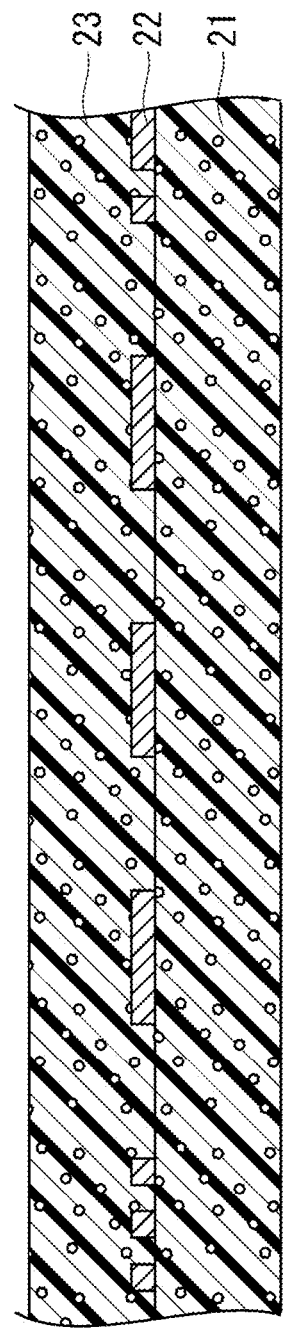
FIG. 6A
FIG. 6B

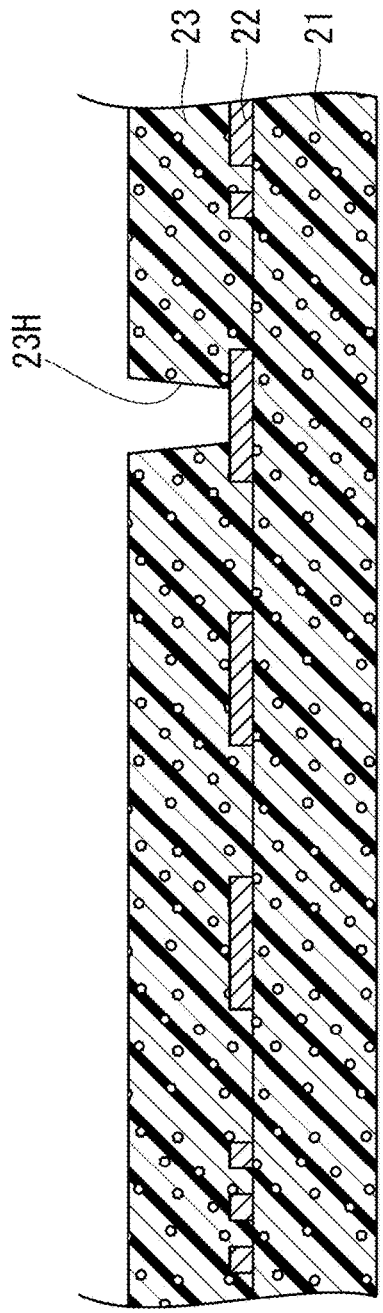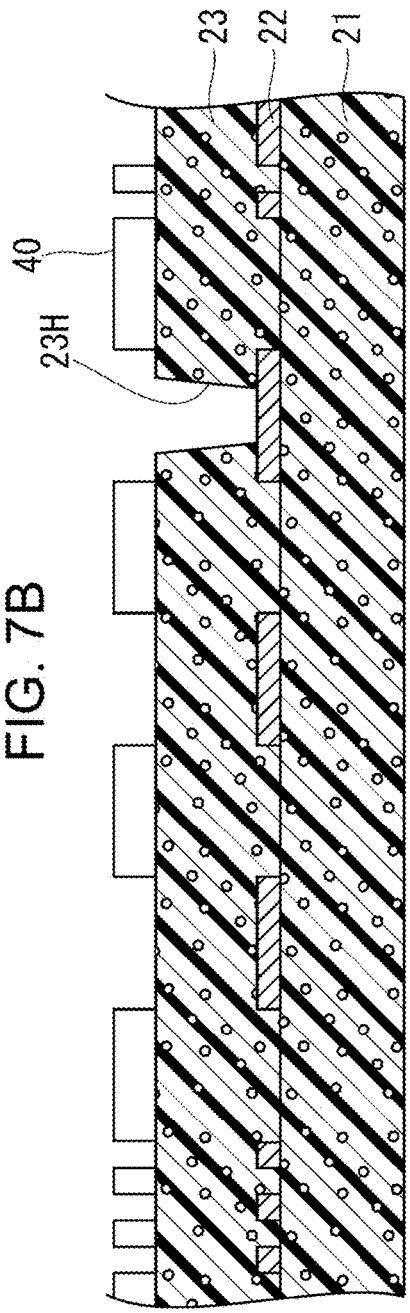

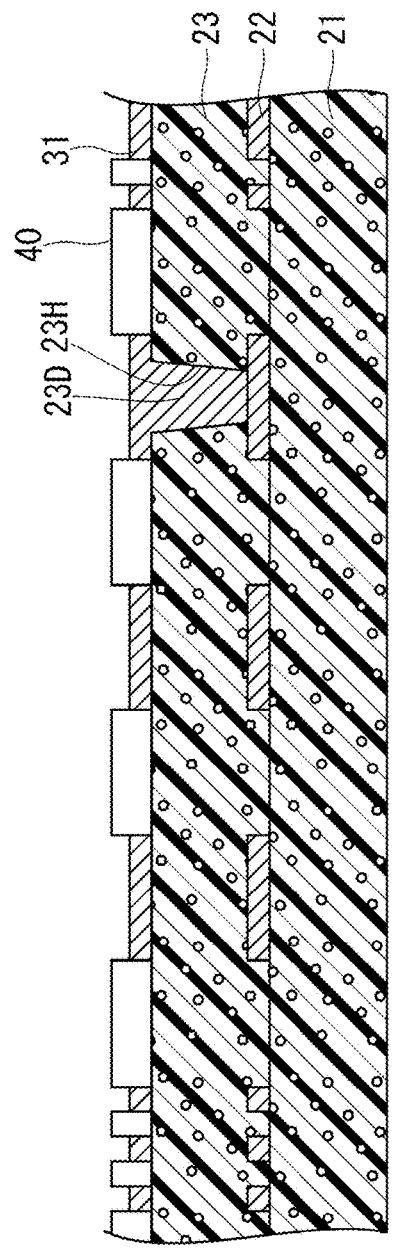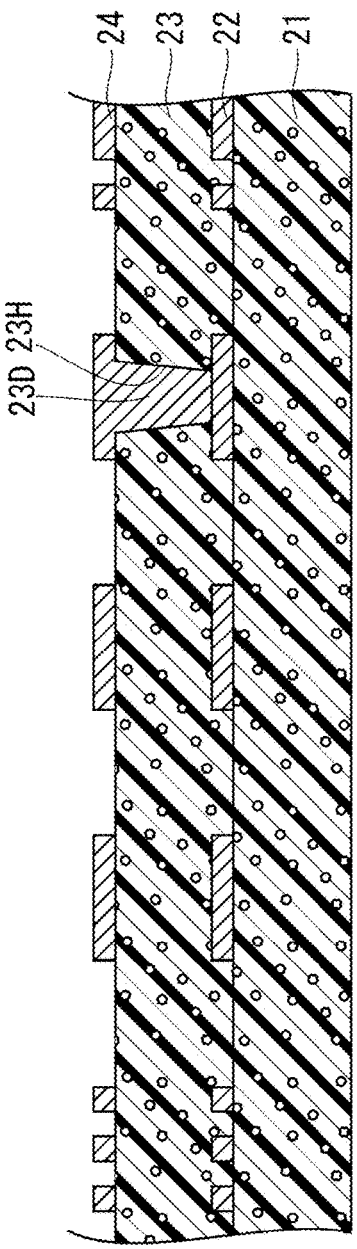

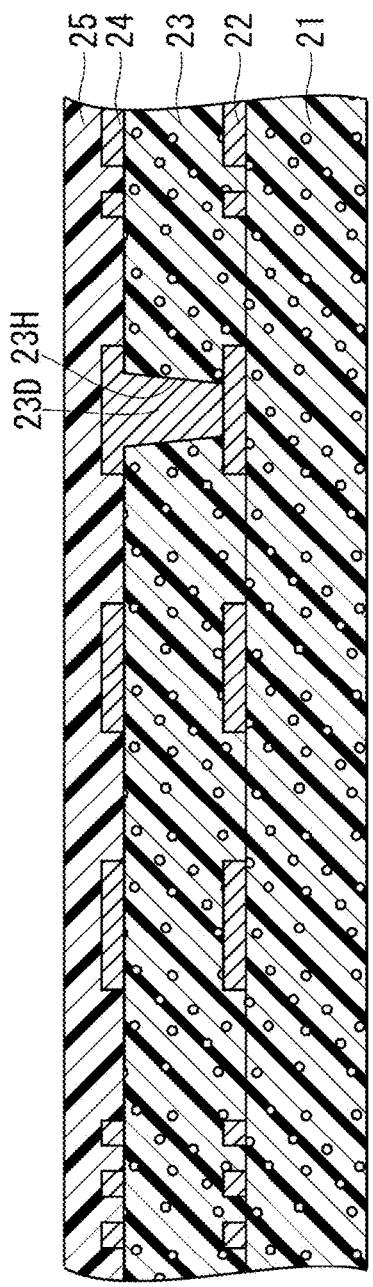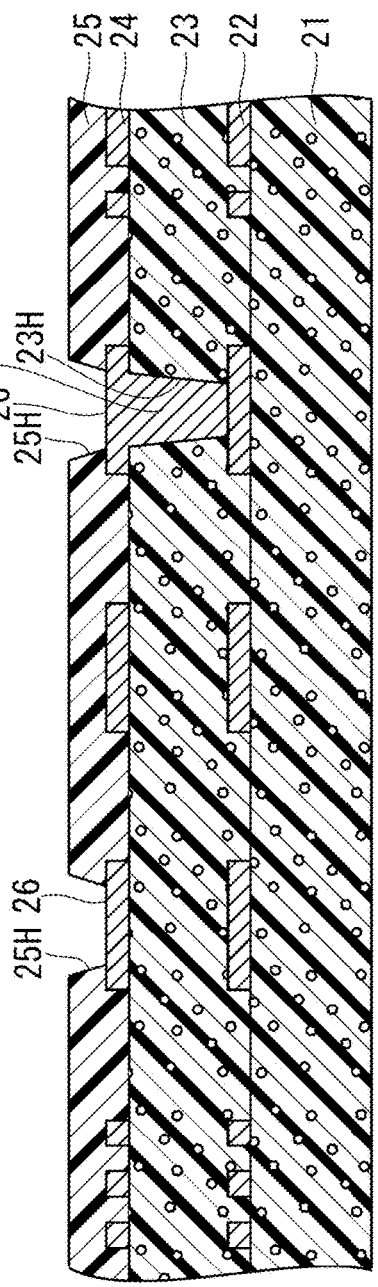

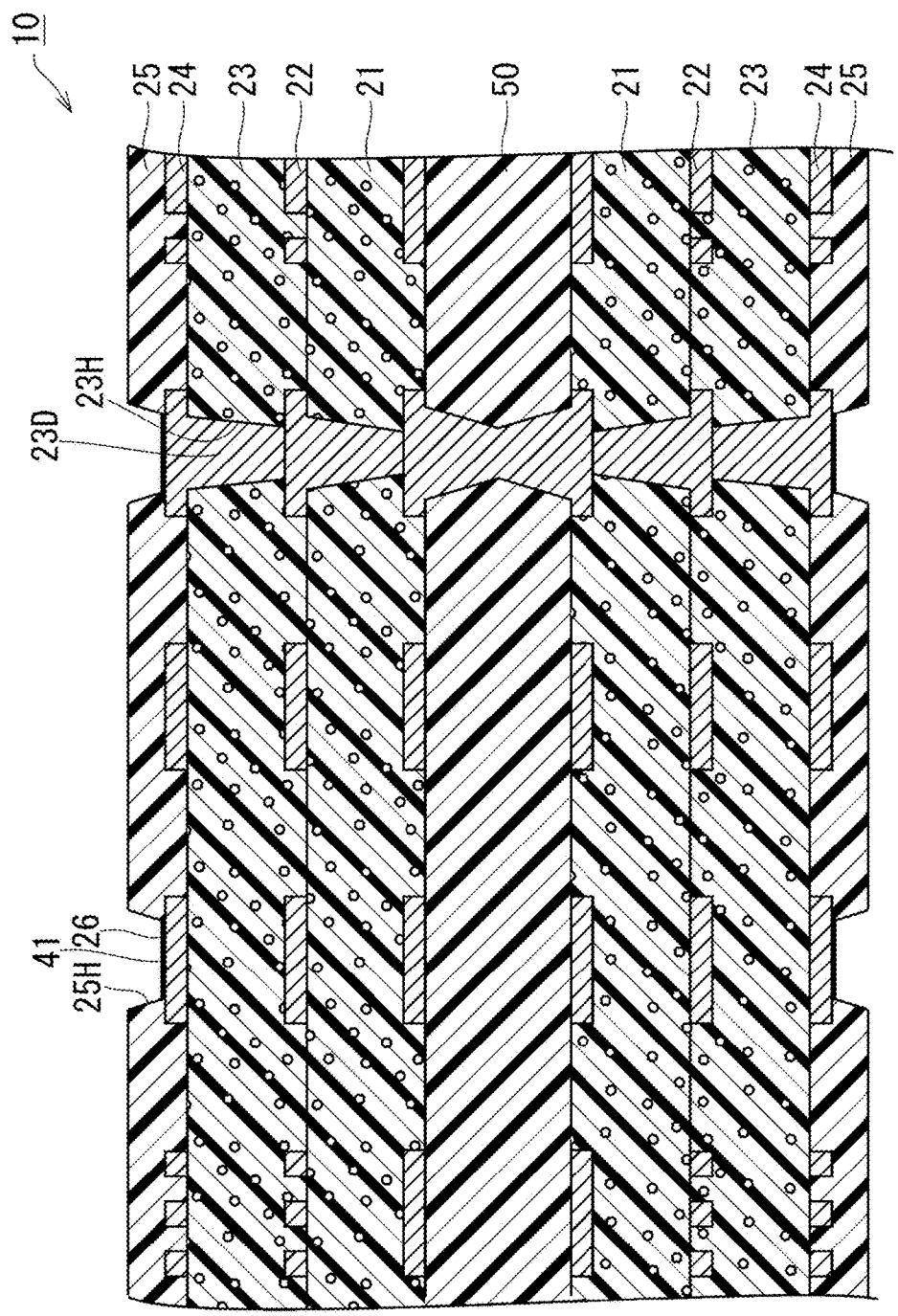

WIRING BOARD AND METHOD FOR MANUFACTURING THE SAME

CROSS-REFERENCE TO RELATED APPLICATIONS

The present application is based upon and claims the benefit of priority to Japanese Patent Application No. 2016-161660, filed Aug. 22, 2016, the entire contents of which are incorporated herein by reference.

BACKGROUND OF THE INVENTION

Field of the Invention

The present invention relates to a wiring board in which a conductive circuit layer is laminated on a surface of an insulating resin layer, and relates to a method for manufacturing the wiring board.

Description of Background Art

For example, Japanese Patent Laid-Open Publication No. 2005-217052 describes a wiring board in which an insulating resin layer contains filler. The entire contents of this publication are incorporated herein by reference.

SUMMARY OF THE INVENTION

According to one aspect of the present invention, a wiring board includes an insulating resin layer including resin material and filler, and a conductive circuit layer laminated on a surface of the insulating resin layer and having wiring patterns. The filler has particle diameters of 15% or less of a minimum width of the wiring patterns when the particle diameters of the filler is measured in a unit range defined such that the unit range has a width and a length where the length is measured from the surface of the insulating resin layer and is selected from a smaller of twice the minimum width of the wiring patterns and a plate thickness of the insulating resin layer, and the width is twice the minimum width of the wiring patterns.

According to another aspect of the present invention, a method for manufacturing a wiring board includes preparing an insulating resin layer including resin material and filler, and forming a conductive circuit layer on a surface of the insulating resin layer such that the conductive circuit layer has wiring patterns laminated on the surface of the insulating resin layer. The filler has particle diameters of 15% or less of a minimum width of the wiring patterns when the particle diameters of the filler is measured in a unit range defined such that the unit range has a width and a length where the length is measured from the surface of the insulating resin layer and is selected from a smaller of twice the minimum width of the wiring patterns and a plate thickness of the insulating resin layer, and the width is twice the minimum width of the wiring patterns.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 is an enlarged cross-sectional side view around a wiring pattern;

FIG. 4A-4C are cross-sectional side views illustrating manufacturing processes of the wiring board;

FIGS. 6A and 6B are cross-sectional side views illustrating manufacturing processes of the wiring board;

FIGS. 7A and 7B are cross-sectional side views illustrating manufacturing processes of the wiring board;

FIGS. 8A and 8B are cross-sectional side views illustrating manufacturing processes of the wiring board;

FIGS. 9A and 9B are cross-sectional side views illustrating manufacturing processes of the wiring board; and FIG. 10 is a cross-sectional side view of a wiring board according to a modified embodiment.

DETAILED DESCRIPTION OF THE EMBODIMENTS

Figure 1:
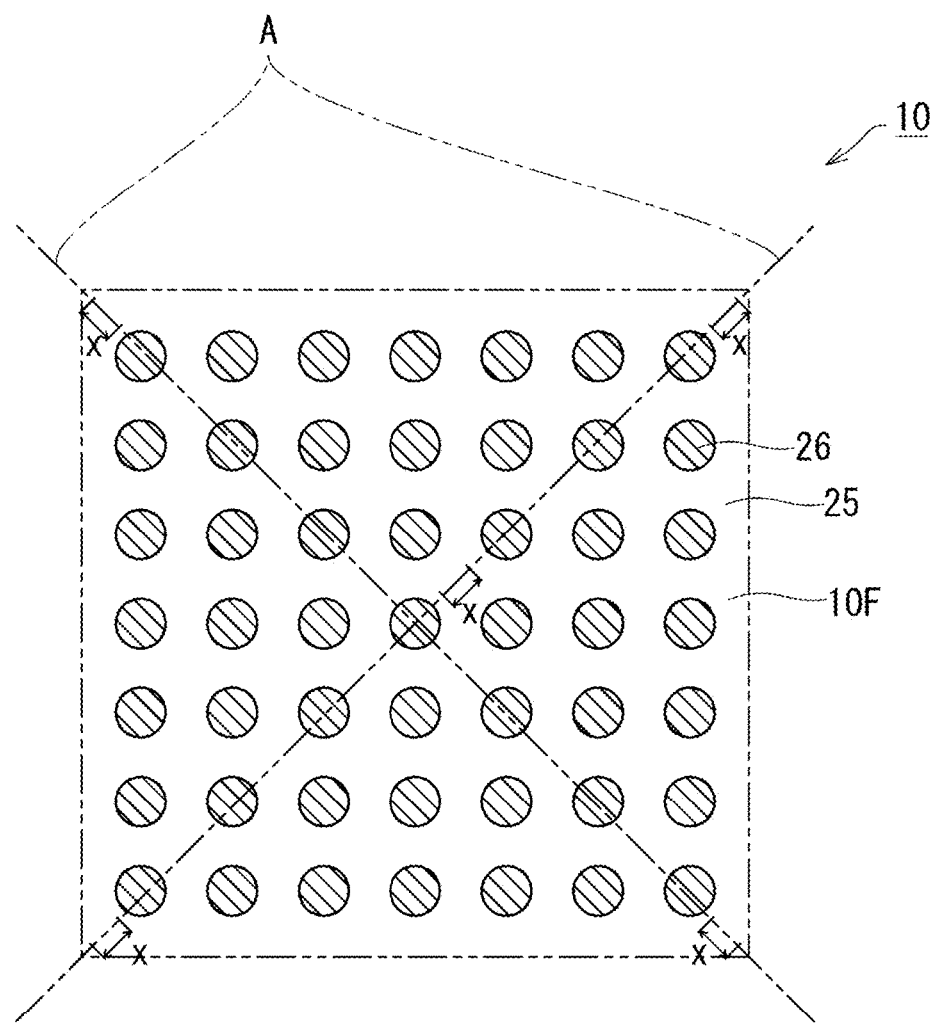
FIG. 1 is a plan view of a wiring board according to an embodiment of the present invention.

Embodiments will now be described with reference to the accompanying drawings, wherein like reference numerals designate corresponding or identical elements throughout the various drawings.

Figure 2:
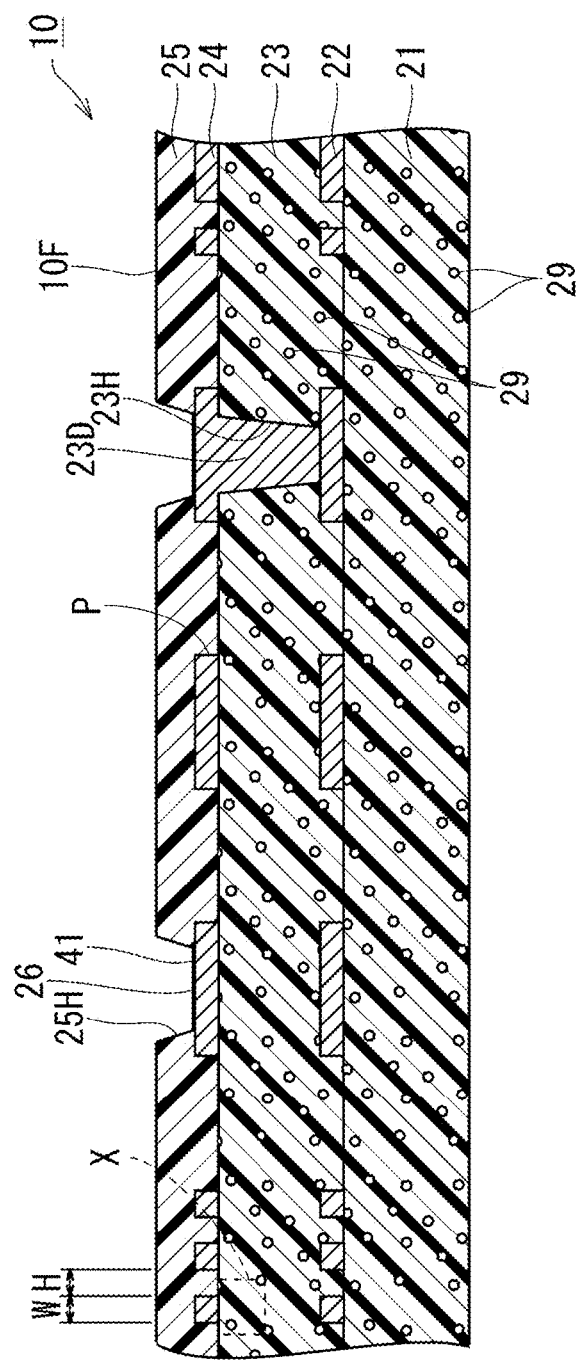
FIG. 2 is a cross-sectional side view of the wiring board.

In the following, an embodiment of the present invention is described with reference to FIG. 1-9B. FIG. 1 illustrates a plan view of a wiring board 10. FIG. 2 illustrates a cross-sectional structure of the wiring board 10.

As illustrated in FIG. 2, the wiring board 10 is formed by laminating a first insulating resin layer 21, a first conductive circuit layer 22, a second insulating resin layer 23, and second conductive circuit layer 24 in this order. The first and second insulating resin layers (21, 23) are each a build-up film formed of an epoxy resin of the like. The insulating resin layers (21, 23) each have a thickness of 10-20 μm.

Multiple via holes (23H) are formed in the second insulating resin layer 23. The via holes (23H) are filled with plating, and multiple via conductors (23D) are formed. Due to the via conductors (23D), the first conductive circuit layer 22 and the second conductive circuit layer 24 are connected to each other. Further, the via holes (23H) each have a tapered shape that is gradually reduced in diameter toward the first insulating resin layer 21 side. The via conductors (23D) each have a top diameter of 20-50 μm and a bottom diameter of 15-40 μm.

A solder resist layer 25 is laminated on the second conductive circuit layer 24. Multiple pad holes (25H) are formed in the solder resist layer 25. Of the second conductive circuit layer 24, portions that are respectively exposed from the pad holes (25H) become pads 26. On a front side surface (10F) of the entire wiring board 10, as illustrated in FIG. 1, the multiple pads 26 are arrayed in a form of a matrix.

FIG. 3 illustrates an enlarged view around a wiring pattern (P) in the second conductive circuit layer 24 as an example for describing the first conductive circuit layer 22 and the second conductive circuit layer 24. In FIG. 3, the solder resist layer 25 is omitted. As illustrated in FIG. 3, the first and second conductive circuit layers (22, 24) each include an electroless plating layer 30 formed on the insulating resin layers (21, 23), and an electrolytic plating layer 31 formed on the electroless plating layer 30. Further, the first and second conductive circuit layers (22, 24) each have a thickness of 5-15 μm. Further, in the first and second conductive circuit layers (22, 24), a minimum width (W) (see FIG. 2) of a wiring pattern (P) and a minimum distance (H) (see FIG. 2) between wiring patterns (P) are both 5 μm.

The first insulating resin layer 21 and the second insulating resin layer 23 each contain an inorganic filler 29 such as silica, alumina or mullite. In the present embodiment, all particles of the inorganic fillers 29 contained in the insulating resin layers (21, 23) have sizes of 0.1 μm or less, and an average particle size of the particles is 0.03-0.1 μm. That is, all particle sizes of the inorganic fillers 29 are 7% or less of the minimum width (W) (5 μm) of the wiring patterns (P) of the present embodiment. The first insulating resin layer 21 and second insulating resin layer 23 both do not contain a glass cloth.

Further, when the first insulating resin layer 21 and the second insulating resin layer 23 are divided into unit solids, for example, each having a height of twice the minimum width (W) of the wiring patterns (P), a width of twice the minimum width (W), and a length of twice the minimum width (W), the inorganic filler 29 is dispersed such that content rates of the inorganic filler 29 in these unit solids are all 30-80 wt %. Further, the inorganic filler 29 is uniformly distributed such that, in the first insulating resin layer 21 or the second insulating resin layer 23, a region that has a diameter of 80% of the minimum width (W) of the wiring patterns (P) and where a content rate of the inorganic filler 29 is less than 1% does not exist.

When the content rates are as described above, in any cross section of the first insulating resin layer 21 or the second insulating resin layer 23, an occupancy rate of cross-sectional areas of the particles of the inorganic filler 29 is 45-65% in an entire area of a unit area having a height of twice the minimum width (W) of the wiring patterns (P) and a width of twice the minimum width (W).

As illustrated in FIG. 3, surfaces of the first insulating resin layer 21 and the second insulating resin layer 23 are rough surfaces having an arithmetic average roughness of 0.03-0.12 μm. In some portions of these surfaces, some particles of the inorganic filler 29 are exposed, and some particles of the inorganic filler 29 are detached so that there are spherically recessed portions.

By having the above-described structure, in cross sections at any five places in the first insulating resin layer 21 or the second insulating resin layer 23, when a unit area (corresponding to a "unit range" according to an embodiment of the present invention) including an upper edge of the first insulating resin layer 21 or the second insulating resin layer 23 is sampled, diameters of cross sections of all particles of the inorganic filler 29 contained in each unit area are 0.1 μm or less and are 7% or less of the minimum width (W) of the wiring patterns (P) above the particles, and an occupancy rate of cross-sectional areas of the particles of the inorganic filler 29 in the entire area of each unit area is 45-65%.

Since a larger number of particles of the inorganic filler 29 are contained in the first insulating resin layer 21 and the second insulating resin layer 23, a maximum diameter of the cross sections of the particles of the inorganic filler 29 contained in the unit area can be regarded as a maximum diameter of a group of particles of the inorganic filler 29 of which cross sections appear in the unit area.

Next, a method for manufacturing the wiring board 10 of the present embodiment is described.

Figure 5A:
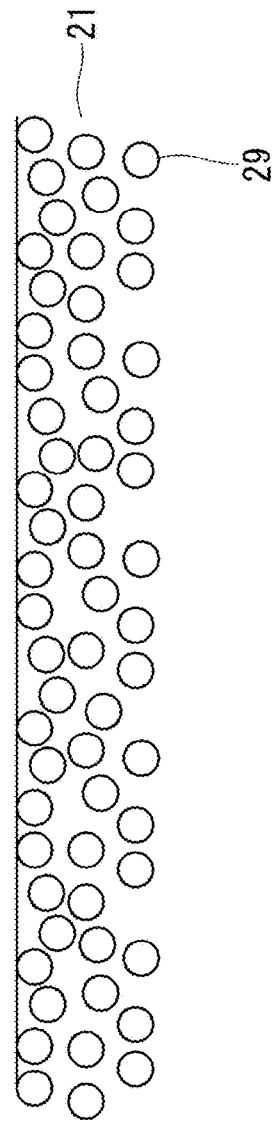
FIGS. 5A and 5B are cross-sectional side views illustrating manufacturing processes of the wiring board.

(1) As illustrated in FIGS. 4A and 5A, a build-up film is prepared as the first insulating resin layer 21.

Figure 5B:
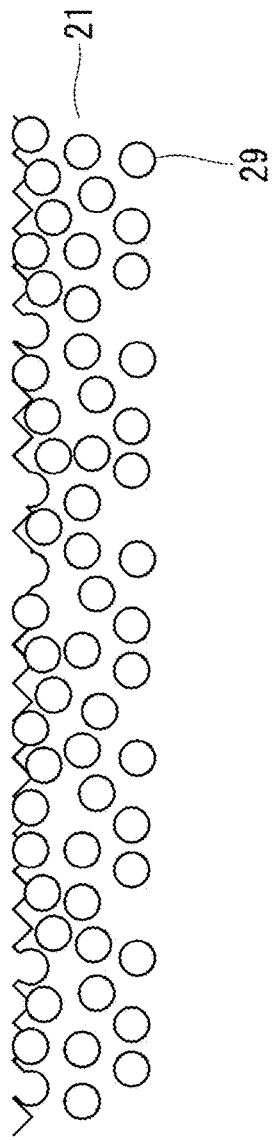

(2) As illustrated in FIG. 5B, the surface of the first insulating resin layer 21 is roughened using a chemical liquid (for example, a Besmear liquid containing permanganate). In this case, some of the particles of the inorganic filler 29 contained in the first insulating resin layer 21 are exposed, and, of these particles of the inorganic filler 29, those having outer peripheral surfaces exposed by more than a half hemisphere are detached, and spherical recesses are formed on the surface of the first insulating resin layer 21.

(3) An electroless plating treatment is performed. An electroless plating film (not illustrated in the drawings) is formed on the first insulating resin layer 21.

(4) As illustrated in FIG. 4B, a plating resist 40 of a predetermined pattern is formed on the electroless plating film.

(5) An electrolytic plating treatment is performed. As illustrated in FIG. 4C, an electrolytic plating layer 31 is formed on portions of the electroless plating film on the first insulating resin layer 21, the portions being exposed from the plating resist 40.

(6) The plating resist 40 is peeled off, and the electroless plating film (not illustrated in the drawings) under the plating resist 40 is removed. As illustrated in FIG. 6A, the first conductive circuit layer 22 is formed on the first insulating resin layer 21 by the remaining electroless plating film (that is, the electroless plating layer 30 (see FIG. 3)) and electrolytic plating layer 31.

(7) As illustrated in FIG. 6B, as the second insulating resin layer 23, a build-up film is laminated on the first conductive circuit layer 22 and is hot pressed.

(8) Similar to the process of (2), the surface of the second insulating resin layer 23 is roughened.

(9) As illustrated in FIG. 7A, CO2 laser or UV laser is irradiated to the second insulating resin layer 23, and the via holes (23H) are formed.

(10) An electroless plating treatment is performed. An electroless plating film (not illustrated in the drawings) is formed on the second insulating resin layer 23 and in the via holes (23H).

(11) As illustrated in FIG. 7B, a plating resist 40 of a predetermined pattern is formed on the electroless plating film.

(12) An electrolytic plating treatment is performed. As illustrated in FIG. 8A, the via holes (23H) are filled with plating and the via conductors (23D) are formed. Further, an electrolytic plating film 31 is formed on portions of the electroless plating film (not illustrated in the drawings) on the second insulating resin layer 23, the portions being exposed from the plating resist 40.

(13) The plating resist 40 is peeled off, and the electroless plating film (not illustrated in the drawings) under the plating resist 40 is removed. As illustrated in FIG. 8B, the second conductive circuit layer 24 is formed on the second insulating resin layer 23 by the remaining electroless plating film (that is, electroless plating layer 30 (see FIG. 3)) and electrolytic plating layer 31. Then, the first conductive circuit layer 22 and the second conductive circuit layer 24 on the front and back sides of the second insulating resin layer 23 are connected to each other by the via conductors (23D).

(14) As illustrated in FIG. 9A, the solder resist layer 25 is laminated on the second conductive circuit layer 24.

(15) As illustrated in FIG. 9B, the tapered pad holes (25H) are formed at predetermined places in the solder resist layer 25, and portions of the second conductive circuit layer 24 exposed from the pad holes (25H) become the pads 26.

(16) On each of the pads 26, a nickel layer, a palladium layer and a gold layer are laminated in this order and a metal film 41 illustrated in FIG. 2 is formed. As a result, the wiring board 10 is completed. The above-described method for forming the first and second conductive circuit layers (22, 24) is referred to as a semi-additive method.

When the wiring board 10 is inspected, for example, as illustrated in FIG. 1, the wiring board 10 is cut on diagonal lines (A), and, in each of cross sections at five places (each indicated with a symbol "X" in FIG. 1) including four corners and a center of the wiring board 10, a unit area (X) (see FIG. 2) having a depth of twice the minimum width (W) of the wiring patterns (P) from the surface of the second insulating resin layer 23 and a width of twice the minimum width (W) is set in the second insulating resin layer 23. The unit area is preferably set to a region directly under a wiring pattern (P) having the minimum width (W) (in particular, a position where a center of the wiring pattern (P) having the minimum width (W) and a center of the unit area are lined up). When the second insulating resin layer 23 has a thickness smaller twice the minimum width (W) of the wiring patterns (P), the depth of the unit area is the entire thickness of the second insulating resin layer 23.

Then, whether or not a maximum diameter of the cross sections of the particles of the inorganic filler 29 contained in each unit area is 7% or less of the minimum width (W) of the wiring patterns (P) is determined, and when the maximum diameter is larger than 7% of the minimum width (W), the wiring board 10 is regarded as defective. Further, whether or not an occupancy rate of the cross-sectional areas of the particles of the inorganic filler 29 is 45-65% in the entire area of each unit area is determined, and when the occupancy rate is other than 45-65%, the wiring board 10 may be regarded as defective. The diameters of the cross sections of the particles of the inorganic filler 29 and the occupancy rate of the cross-sectional areas of the particles of the inorganic filler 29 can be measured, for example, by binarizing a photomicrograph of a cross section of the second insulating resin layer 23 using a commercially available image analysis software.

The description about the structure and the manufacturing method of the wiring board 10 of the present embodiment is as given above. Next, an example of use and an operation effect of the wiring board 10 are described. The wiring board 10 of the present embodiment is used by forming solder bumps on the pads 26 and mounting and soldering an electronic component such as a CPU on the solder bumps.

Here, surfaces of the particles of the inorganic filler 29 are smooth. Therefore, when large particles of the inorganic filler 29 are positioned on the surfaces of the insulating resin layers (21, 23), adhesion of the conductive circuit layers (22, 24) decreases and peeling may occur. In the wiring board 10 of the present embodiment, the particle sizes of the inorganic filler 29 contained in the first and second insulating resin layers (21, 23) are as sufficiently small as 7% or less of the minimum width (W) of the wiring patterns (P). Therefore, a decrease in the adhesion of the conductive circuit layers (22, 24) is suppressed, and occurrence of peeling of the conductive circuit layers (22, 24) is prevented. As a result, disconnection in the conductive circuit layers (22, 24) is prevented.

Further, in an insulating resin layer containing inorganic filler, when the insulating resin layer repeats expansion and contraction due to heat received from an electronic component, particles of the inorganic filler exposed from a surface of the insulating resin layer may be detached. In this case, when a wiring pattern (P) is formed above detached particles of the inorganic filler, disconnection may occur in the wiring pattern (P).

In contrast, in the wiring board 10 according to an embodiment of the present invention, as described above, the particles sizes of the inorganic filler 29 contained in the first and second insulating resin layers (21, 23) are sufficiently small, and thus, even when the particles of the inorganic filler 29 are detached, disconnection in the wiring patterns (P) is suppressed.

Further, in the insulating resin, a thermal expansion coefficient decreases as the content rate of the inorganic filler 29 increases. Therefore, when there is a portion where the content rate of the inorganic filler 29 is extremely small in the insulating resin layers (21, 23), a difference in thermal expansion coefficient in the insulating resin layers (21, 23) increases, and a strain occurs in the wiring patterns (P) of the conductive circuit layers (22, 24) so that disconnection in the wiring patterns (P) may occur.

In contrast, in the present embodiment, the inorganic filler 29 is uniformly dispersed such that the content rate of the inorganic filler 29 in any arbitrarily set unit solid is 30-80 wt %. Therefore, the difference in thermal expansion coefficient in the insulating resin layers (21, 23) can be reduced, and disconnection in the wiring patterns (P) is prevented. Further, by reducing the difference in thermal expansion coefficient in the insulating resin layers (21, 23), detachment of the particles of the inorganic filler 29 can also be reduced.

Other Embodiments

The present invention is not limited to the above-described embodiments. For example, the embodiments described below are also included in the technical scope of the present invention. Further, in addition to the embodiments described below, the present invention can also be embodied in various modified forms within the scope without departing from the spirit of the present invention.

(1) As illustrated in FIG. 10, it is also possible to have a structure in which a core substrate 50 is provided and the insulating resin layers (21, 23) and the conductive circuit layers (22, 24) are laminated on each of both front and back sides of the core substrate 50.

(2) In the above embodiment, two insulating resin layers (the insulating resin layers (21, 23)) and two conductive circuit layers (the conductive circuit layers (22, 24)) are provided. However, it is also possible that one insulating resin layer and one conductive circuit layer are provided, or three or more insulating resin layers and three or more conductive circuit layers are provided.

(3) In the above embodiment, all the particle sizes of the inorganic filler 29 contained in the entire insulating resin layers (21, 23) are 0.1 μm or less. However, it is sufficient that the particle sizes of the inorganic filler 29 contained in an upper portion of the insulating resin layer (21 or 23) near the conductive circuit layer (22 or 24) (the portion having a depth of twice the minimum width (W) of the wiring patterns (P) from the surface of the insulating resin layer (21 or 23)) is 0.1 μm or less, and the particle sizes of the inorganic filler 29 contained in a lower portion of each of the insulating resin layers (21, 23) may be larger than 0.1 μm.

(4) In the above embodiment, the particle sizes of the inorganic filler 29 contained in the insulating resin layers (21, 23) are 0.1 μm or less. However, the present invention is not limited to this. It is sufficient that the particle sizes of the inorganic filler 29 are 15% or less of the minimum width (W) of the wiring patterns (P) in the conductive circuit layers (22, 24) above the inorganic filler 29. When the particle sizes of the inorganic filler 29 are 15% or less of the minimum width (W) of the wiring patterns (P), disconnection in the wiring patterns (P) is sufficiently suppressed. Preferably, the inorganic filler 29 has particle sizes of 0.5 μm or less, and an average particle size of 0.03-0.3 μm.

Further, in the above embodiment, in the inspection of the wiring board 10, whether or not a maximum diameter of the cross sections of the particles of the inorganic filler 29 contained in each unit area is 7% or less of the minimum width (W) of the wiring patterns (P) is determined. However, it is also possible that whether or not a maximum diameter of the cross sections of the particles of the inorganic filler 29 contained in each unit area is 15% or less of the minimum width (W) of the wiring patterns (P) is determined.

(5) In the above embodiment, the minimum width (W) of the wiring patterns (P) in the conductive circuit layers (22, 24) is 5 μm. However, the minimum width (W) may be other values as long as the minimum width (W) is 8 μm or less.

(6) In the above embodiment, "filler" according to an embodiment of the present invention is the inorganic filler 29. However, the "filler" may also be an organic filler.

(7) Almost all particle sizes of the inorganic filler 29 contained in the insulating resin layers (21, 23) are 15% or less of the minimum width (W) of the wiring patterns (P). However, a case where, exceptionally (for example, with a probability of 1/100000 or less), some particles of the inorganic filler 29 having sizes larger than 15% of the minimum width (W) are contained, that is, a case where substantially all of the particles of the inorganic filler 29 contained in the insulating resin layers (21, 23) are 15% or less of the minimum width (W) of the wiring patterns (P), is also included in the technical scope of the present invention. In this case, preferably, the sizes of the particles of the inorganic filler 29 that are exceptionally contained are 2 μm or less and 50% or less of the minimum width (W) of the wiring patterns (P).

In a wiring board, suppression of disconnection in a conductive circuit layer is desired.

A wiring board according to an embodiment of the present invention includes: an insulating resin layer containing filler; and a conductive circuit layer laminated on a surface of the insulating resin layer. In each of cross sections at five places including four corners and a center of the insulating resin layer, diameters of cross sections of all particles of the filler contained in a unit range are 15% or less of a minimum width of wiring patterns in the conductive circuit layer, the unit range having a length, from the surface, of the smaller of twice the minimum width and a plate thickness of the insulating resin layer, and a width of twice the minimum width.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring board, comprising:
an insulating resin layer comprising resin material and filler; and
a conductive circuit layer laminated on a surface of the insulating resin layer and having a plurality of wiring patterns,
wherein the filler has particle diameters of 15% or less of a minimum width of the wiring patterns when the particle diameters of the filler are measured in a unit range defined such that the unit range has a width and a length where the length is measured from the surface of the insulating resin layer and is selected from a smaller of twice the minimum width of the wiring patterns and a thickness of the insulating resin layer, and the width is twice the minimum width of the wiring patterns.

2. A wiring board according to claim 1, wherein the filler has cross-sectional areas that is an occupancy rate in a range of 45% to 65% in an entire area of the unit range.

3. A wiring board according to claim 1, wherein the particle diameters of the filler is 7% or less of the minimum width of the wiring patterns when the particle diameters of the filler are measured in the unit range.

4. A wiring board according to claim 1, wherein the filler in the insulating resin layer is uniformly distributed in the resin material of the insulating resin layer such that the insulating resin layer does not have a region where a content rate of the filler is less than 1%.

5. A wiring board according to claim 1, wherein the conductive circuit layer is formed such that the plurality of wiring patterns has the minimum width of 8 μm or less and a minimum distance of 8 μm or less between adjacent wiring patterns.

6. A wiring board according to claim 1, wherein the particle diameters of the filler are 0.5 μm or less in the unit range.

7. A wiring board according to claim 1, wherein the surface of the insulating resin layer is a roughened surface.

8. A wiring board according to claim 1, wherein the insulating resin layer is formed such that the surface of the insulating resin layer has an arithmetic average roughness in a range of 0.03 μm to 0.12 μm.

9. A wiring board according to claim 1, wherein the conductive circuit layer is formed such that the conductive circuit layer has a thickness in a range of 5 μm to 15 μm.

10. A wiring board according to claim 1, wherein the insulating resin layer is formed such that the insulating resin layer has the thickness in a range of 10 μm to 20 μm.

11. A wiring board according to claim 1, further comprising:
a plurality of via conductors formed through the insulating resin layer such that the plurality of via conductors is connected to the conductive circuit layer and has a top diameter in a range of 20 μm to 50 μm.

12. A wiring board according to claim 1, wherein the particle diameters of the filler are measured in the unit range at a set of wiring patterns having the minimum width.

13. A method for manufacturing a wiring board, comprising:
preparing an insulating resin layer comprising resin material and filler; and
forming a conductive circuit layer on a surface of the insulating resin layer such that the conductive circuit layer has a plurality of wiring patterns laminated on the surface of the insulating resin layer,
wherein the filler has particle diameters of 15% or less of a minimum width of the wiring patterns when the particle diameters of the filler are measured in a unit range defined such that the unit range has a width and a length where the length is measured from the surface of the insulating resin layer and is selected from a smaller of twice the minimum width of the wiring patterns and a thickness of the insulating resin layer, and the width is twice the minimum width of the wiring patterns.

14. A method for manufacturing a wiring board according to claim 13, wherein the filler has cross-sectional areas that is an occupancy rate in a range of 45% to 65% in an entire area of the unit range.

15. A method for manufacturing a wiring board according to claim 13, wherein the particle diameters of the filler is 7% or less of the minimum width of the wiring patterns when the particle diameters of the filler are measured in the unit range.

16. A method for manufacturing a wiring board according to claim 13, wherein the filler in the insulating resin layer is uniformly distributed in the resin material of the insulating resin layer such that the insulating resin layer does not have a region where a content rate of the filler is less than 1%.

17. A method for manufacturing a wiring board according to claim 13, wherein the insulating resin layer is formed such that the filler in the insulating resin layer has a content rate in a range of 30 wt % to 80 wt %.

18. A method for manufacturing a wiring board according to claim 13, wherein the conductive circuit layer is formed such that the plurality of wiring patterns has the minimum width of 8 μm or less and a minimum distance of 8 μm or less between adjacent wiring patterns.

19. A method for manufacturing a wiring board according to claim 13, wherein the insulating resin layer is formed such that the surface of the insulating resin layer has an arithmetic average roughness in a range of 0.03 μm to 0.12 μm.

20. A method for manufacturing a wiring board according to claim 13, wherein the forming of the conductive circuit layer comprises forming the conductive circuit layer by a semi-additive process.

\* \* \* \* \*